(12) United States Patent
Yasui

(10) Patent No.: US 12,089,341 B2
(45) Date of Patent: Sep. 10, 2024

(54) COMPONENT MOUNTING SYSTEM AND DATA CREATION DEVICE

(71) Applicant: FUJI CORPORATION, Chiryu (JP)

(72) Inventor: Yoshihiro Yasui, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 650 days.

(21) Appl. No.: 17/425,753

(22) PCT Filed: Feb. 15, 2019

(86) PCT No.: PCT/JP2019/005493
§ 371 (c)(1),
(2) Date: Jul. 26, 2021

(87) PCT Pub. No.: WO2020/166050
PCT Pub. Date: Aug. 20, 2020

(65) Prior Publication Data
US 2022/0322594 A1    Oct. 6, 2022

(51) Int. Cl.
H05K 13/08 (2006.01)
(52) U.S. Cl.
CPC ......... H05K 13/086 (2018.08); H05K 13/085 (2018.08)
(58) Field of Classification Search
CPC .. H05K 13/086; H05K 13/085; H05K 13/021; H05K 13/0417; H05K 13/0857
See application file for complete search history.

(56) References Cited

U.S. PATENT DOCUMENTS

2018/0084684 A1    3/2018  Ohashi et al.
2018/0206372 A1*   7/2018  Yamazaki ............ H05K 13/085

FOREIGN PATENT DOCUMENTS

| JP | 61-75600 A | 4/1986 | |
|---|---|---|---|
| JP | 2005216965 A | * 8/2005 | |
| JP | 2010073958 A | * 4/2010 | |
| JP | 2017028196 A | * 2/2017 | ............. H05K 13/02 |
| WO | WO-2016035145 A1 | * 3/2016 | ......... H05K 13/0069 |

OTHER PUBLICATIONS

International Search Report mailed on May 7, 2019 in PCT/JP2019/005493 filed on Feb. 15, 2019 (2 pages).

* cited by examiner

*Primary Examiner* — Jacob S. Scott
*Assistant Examiner* — Erin Morris
(74) *Attorney, Agent, or Firm* — Oblon, McClelland, Maier & Neustadt, L.L.P.

(57) ABSTRACT

A component mounting system includes a component mounter group, a storage section configured to store multiple production jobs, and a grouping execution section configured to allocate, when grouping the multiple production jobs, production jobs having a degree of commonality in type of components included in each production job satisfying a predetermined determination criterion to the same group, in which the group is set to perform an individual exchange of the component supply device without performing a collective exchange of a pallet of each component mounter when processing the production job belonging to the same group, and to perform the collective exchange of the pallet of each component mounter and not to perform the individual exchange of the component supply device when processing the production job belonging to different groups.

6 Claims, 5 Drawing Sheets

COMPONENT MOUNTING SYSTEM AND DATA CREATION DEVICE

TECHNICAL FIELD

In the present specification, a component mounting system and a data creation device are disclosed.

BACKGROUND ART

Conventionally, there has been known a component mounting system including a component mounter group in which multiple component mounters are arranged along a conveyance direction of a board and a grouping execution section that allocates multiple production jobs to several groups. In the component mounting system, in Patent Literature 1, in a case where the number of components that can be set in a component mounter is limited, the number of setup replacements is reduced by aggregating boards of similar component types to be used when grouping production jobs. Specifically, neither setup replacement nor component exchange is performed when processing production jobs belonging to the same group, and the setup replacement is performed when processing production jobs belonging to different groups. The setup replacement is an operation of collectively exchanging components set in the component supply section.

PATENT LITERATURE

Patent Literature 1: JP-A-61-75600

BRIEF SUMMARY

Technical Problem

However, when neither setup replacement nor component exchange is performed when processing production jobs belonging to the same group, the number of production jobs belonging to the same group may be reduced, and as a result, the number of groups increases. As the number of groups increases, the number of setup replacements increases, which is not preferable.

The present disclosure is made in view of the above-mentioned problems, and a main object thereof is to appropriately group production jobs.

Solution to Problem

According to the present disclosure, there is provided a component mounting system including: a component mounter group in which multiple component mounters in which multiple component supply devices are detachably set in a pallet and configured to mount a component supplied by the component supply device on a mounting target are arranged along a conveyance direction of the mounting target; a storage section configured to store multiple production jobs including information on what type of component is mounted on a board; and a grouping execution section configured to allocate, when grouping multiple production jobs, production jobs having a degree of commonality in type of components included in each production job satisfying a predetermined determination criterion to the same group, in which the group is set to perform an individual exchange of the component supply device without performing a collective exchange of the pallet of each component mounter when processing the production job belonging to the same group, and to perform the collective exchange of the pallet of each component mounter and not to perform the individual exchange of the component supply device when processing the production job belonging to different groups.

In this component mounting system, when grouping the multiple production jobs, the production job having the degree of commonality in type of components included in each production job satisfying the predetermined determination criterion is allocated to the same group. Since production jobs belonging to different groups have a low degree of commonality in type of components, the number of component supply devices to be exchanged increases, and thus, the collective exchange of the pallet can be performed in a shorter time than the individual exchange of the component sharing device. Meanwhile, since the production jobs belonging to the same group have a high degree of commonality in type of components, the number of component supply devices to be individually exchanged can be suppressed, and thus, the individual exchange of the component supply device can be performed in a shorter time than the collective exchange of the pallet. Therefore, it is possible to appropriately group the production jobs.

DESCRIPTION OF EMBODIMENTS

Figure 1:
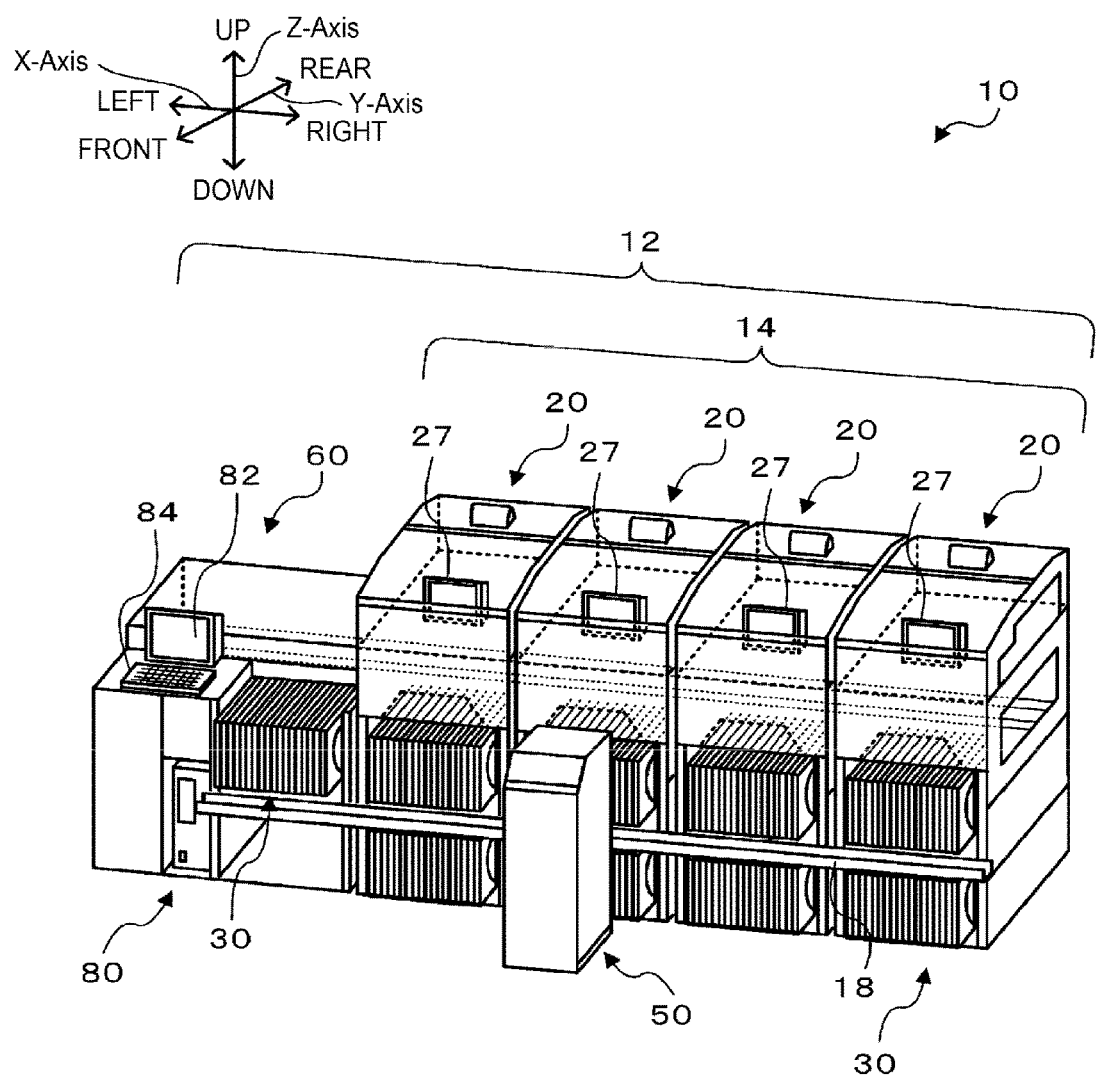
FIG. 1 is a perspective view schematically illustrating component mounting system 10.
Figure 2:
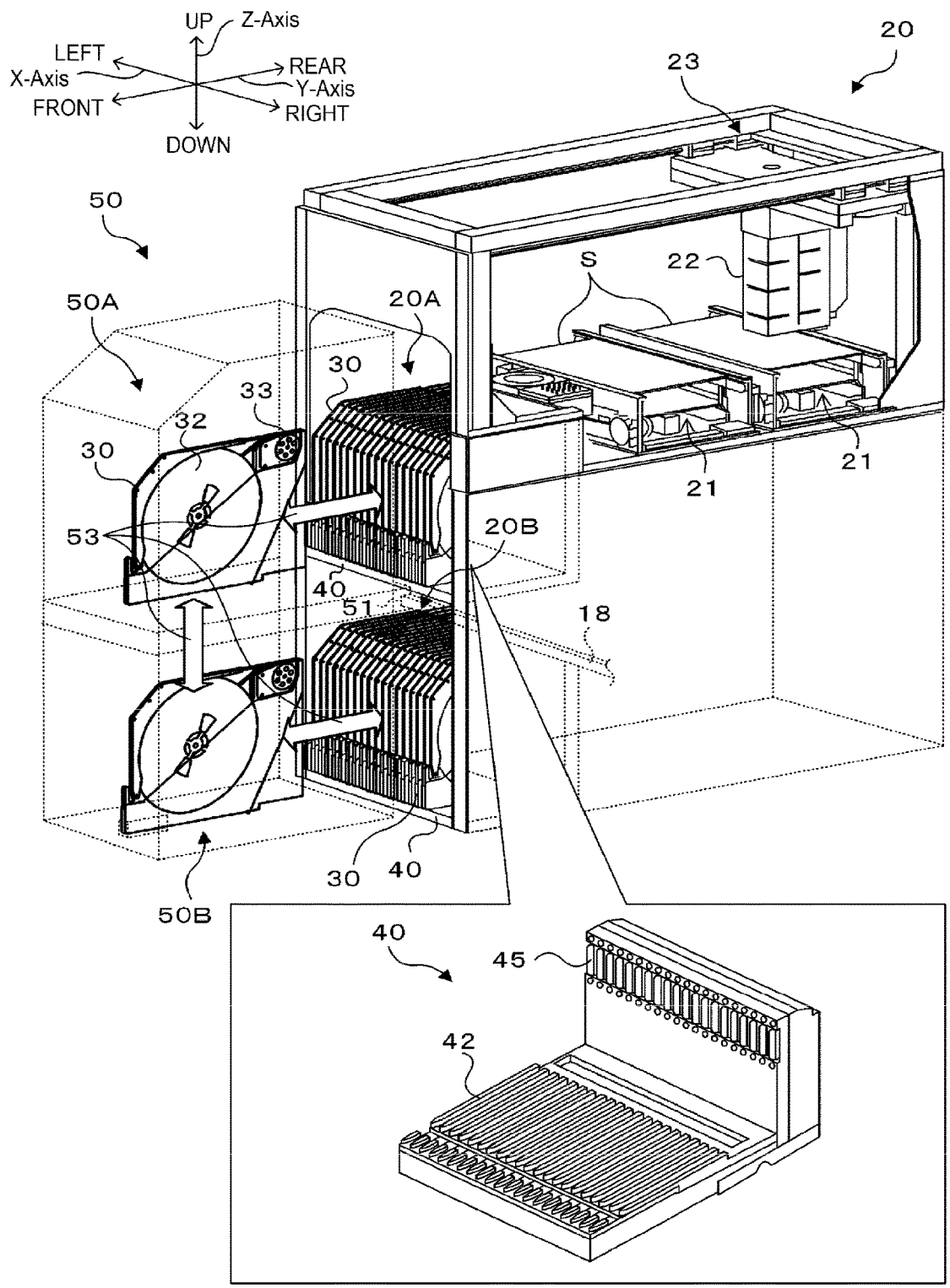
FIG. 2 is a perspective view schematically illustrating component mounter 20.
Figure 3:
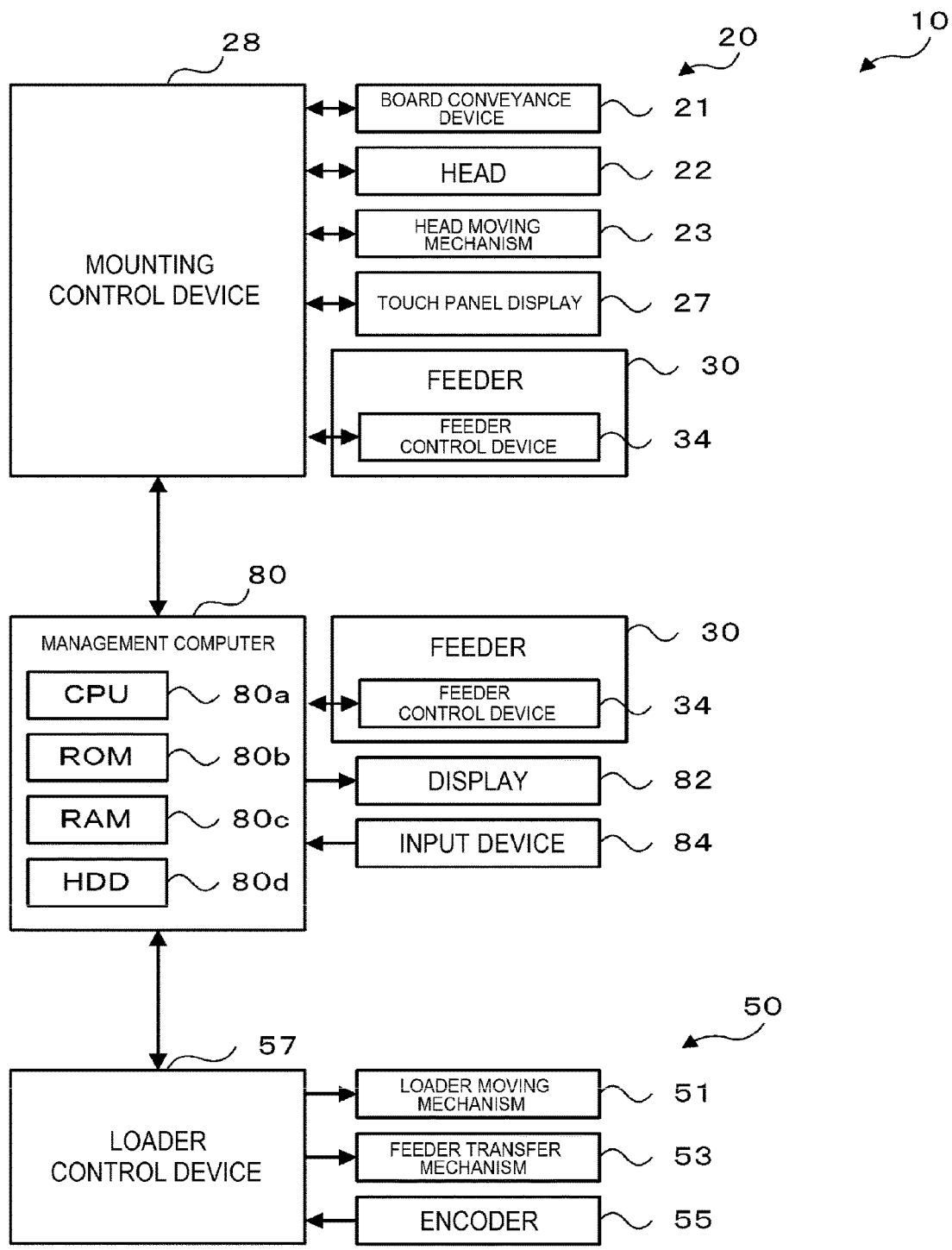
FIG. 3 is a block diagram illustrating a configuration related to a control of component mounting system 10.

Next, embodiments of the present disclosure will be described with reference to the drawings. FIG. 1 is a perspective view schematically illustrating component mounting system 10 according to the present embodiment, FIG. 2 is a perspective view schematically illustrating component mounter 20, and FIG. 3 is a block diagram illustrating a configuration related to a control of component mounting system 10. A right-left direction in FIG. 1 is an X-direction, a front-rear direction is a Y-direction, and an up-down direction is a Z-direction.

As illustrated in FIG. 1, component mounting system 10 includes component mounting line 12, loader 50, and management computer 80. In component mounting line 12, component mounter group 14 and feeder storage 60 are arranged in the X-direction. In component mounter group 14, multiple component mounters 20 are arranged in the X-direction. Component mounter 20 mounts a component supplied from feeder 30 on board S (refer to FIG. 2). board S is conveyed from a left side (upstream side) to a right side (downstream side) of component mounting line 12 along the X-direction. Feeder storage 60 is disposed on the upstream side of component mounter group 14, and stores feeder 30 to be used or used feeder 30 in component mounter 20. Loader 50 can automatically exchange feeder 30 between loader 50 and component mounter 20 or between loader 50 and feeder storage 60. Management computer 80 manages the entire system.

As illustrated in FIG. 2, component mounter 20 includes board conveyance device 21 that conveys board S in the X-direction, head 22 having a nozzle that picks up a component supplied by feeder 30, head moving mechanism 23 that moves head 22 in the XY-directions, and touch panel display 27 (refer to FIG. 1). In addition, component mounter 20 includes mounting control device 28 (refer to FIG. 3) configured by well-known a center processing unit (CPU), a read only memory (ROM), a random access memory (RAM), or the like. Mounting control device 28 controls entire component mounter 20. Mounting control device 28 can input and output a signal to and from board conveyance device 21, head 22, head moving mechanism 23, touch panel display 27, or the like. In addition, component mounter 20 has two upper and lower areas to which feeder 30 can be attached in the front. The upper area is supply area 20A to which feeder 30 can supply the component, and the lower area is stock area 20B in which feeder 30 can be stocked. Pallet 40 formed in an L-shape in a side view is provided in supply area 20A and stock area 20B. Multiple feeders 30 are attached to each pallet 40.

As illustrated in FIG. 2, feeder 30 is configured as a tape feeder that feeds a tape accommodating components at a predetermined pitch. Feeder 30 includes tape reel 32 around which the tape is wound, tape feeding mechanism 33 that feeds the tape from tape reel 32, and feeder control device 34 (refer to FIG. 3). As illustrated in FIG. 2, pallet 40 includes multiple slots 42 arranged in the X-direction at intervals at which feeder 30 can be inserted. When feeder 30 is inserted into slot 42 of pallet 40, a connector (not illustrated) of feeder 30 is connected to connector 45 of pallet 40. Accordingly, feeder control device 34 can communicate with a control section (such as mounting control device 28 or management computer 80) to which feeder 30 is attached. Feeder control device 34 feeds the component accommodated in the tape to a predetermined component supplying position by the tape feeding mechanism 33, and when the component at the component supplying position is picked up by the nozzle of head 22, feeds the component accommodated in the tape to a predetermined component supplying position again by tape feeding mechanism 33.

As illustrated in FIG. 1, loader 50 can move along X-axis rail 18 provided parallel to the conveyance direction (X-direction) of the board on front surfaces of multiple component mounters 20 and a front surface of feeder storage 60. As illustrated in FIG. 2 and FIG. 3, loader 50 includes loader moving mechanism 51 and feeder transfer mechanism 53. Loader moving mechanism 51 moves loader 50 along the X-axis rail 18. Feeder transfer mechanism 53 is configured to attach feeder 30 from loader 50 to component mounter 20 or feeder storage 60, to detach feeder 30 from component mounter 20 or feeder storage 60 and store feeder 30 in loader 50, or to move feeder 30 between upper transfer area 50A and lower transfer area 50B. As illustrated in FIG. 3, loader 50 also includes encoder 55 and loader control device 57. Encoder 55 detects a movement position of loader 50 in the X-direction. Loader control device 57 is configured by well-known CPU, ROM, RAM, and or like. Loader control device 57 receives a detection signal from encoder 55, and outputs a drive signal to loader moving mechanism 51 or feeder transfer mechanism 53.

As illustrated in FIG. 1, feeder storage 60 has pallet 40 similar to component mounter 20 in order to accommodate multiple feeders 30.

As illustrated in FIG. 3, management computer 80 is configured by well-known CPU 80a, ROM 80b, RAM 80c, HDD 80d, or the like, and is connected to display 82 such as an LCD, input device 84 such as a keyboard and a mouse, or the like. HDD 80d of management computer 80 stores a production plan, a production job, or the like. In the present specification, board S on which various predetermined components are mounted is referred to as a product. The production plan is a plan to determine when and how many products will be prepared. The production plan is stored in HDD 80d of management computer 80 by an operator operating input device 84. The production job is determined for each product, and is a job in which components of which component type are mounted on board S in what order for each component mounter 20. The production job is set by CPU 80a of management computer 80 based on the production plan, and stored in HDD 80d. Management computer 80 is connected to mounting control device 28 and loader control device 57 so as to be capable of bidirectional communication. Management computer 80 receives information on a mounting status of component mounter 20 from mounting control device 28, and receives information on a driving status of loader 50 from loader control device 57. Management computer 80 is communicably connected to feeder control device 34 of feeder 30, and thus, can acquire information of feeder 30 stored in feeder storage 60 and information of feeder 30 attached to each component mounter 20.

Next, a grouping routine of production jobs executed by management computer 80 of component mounting system 10 configured as described above will be described. Here, a case where component mounting line 12 produces many types of products will be described. It is assumed that management computer 80 has already set a production job for each of many types of products, and those production jobs are stored in HDD 80d. The production job is optimized in order to improve production efficiency of component mounting line 12. Specifically, the production job is set so as to maximize production efficiency of component mounting line 12 by optimizing a mounting order of the components to be mounted on board S or optimizing a disposition of feeder 30 to be set to component mounter 20 to minimize a movement distance or a movement time of head 22. The optimization of the production job is well known in a field of component mounter 20, and thus, details thereof will be omitted.

Figure 4:
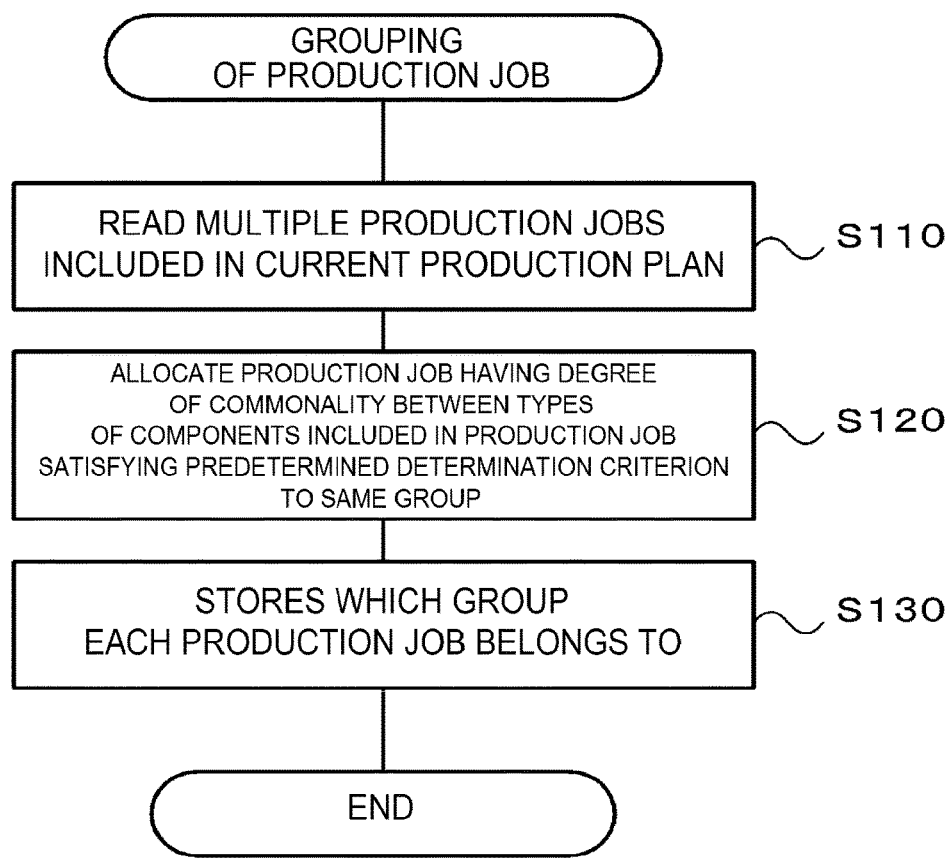
FIG. 4 is a flowchart of a grouping routine of production jobs.

FIG. 4 is a flowchart of a grouping routine of the production jobs. When the grouping routine starts, CPU 80a of management computer 80 reads multiple production jobs included in a current production plan from HDD 80d (S110).

Next, CPU 80a allocates the production job having a degree of commonality in type of components included in the production job satisfying a predetermined determination criterion to the same group (S120). The group is set so as to perform an individual exchange of feeder 30 without performing a collective exchange of pallets 40 of component mounters 20 when processing the production jobs belonging to the same group, and so as to perform the collective exchange of pallets 40 of component mounters 20 and not to perform an individual exchange of feeder 30 when processing the production jobs belonging to different groups. Since the production jobs allocated to the same group have a high degree of commonality in type of components, the number of feeders 30 to be exchanged is small. Accordingly, even when the individual exchange of feeder 30 is performed, the operation can be performed in a relatively short time. Meanwhile, in the production jobs allocated to different groups, since the degree of commonality in type of components is low, the number of feeders 30 to be exchanged is large. Accordingly, since the operation requires a long time when the individual exchange of feeder 30 is performed, the collective exchange of pallet 40 is performed.

Here, the determination criterion may be a condition that the number of individual exchanges of feeder 30 when the production job is switched is equal to or less than a predetermined number of times. Alternatively, the condition may be such that the number of individual exchanges of feeder 30 when the production job is switched is equal to or less than a predetermined ratio with respect to the total number of feeders 30. As a grouping method, general cluster analysis processing or the like may be used.

Next, CPU 80a stores in HDD 80d which group each production job belongs to (S130), and terminates the present routine.

Figure 5:
FIG. 5 is a table illustrating an example of grouping of the production jobs.

An example of the grouping of production jobs is illustrated in FIG. 5. Here, it is assumed that the number of component mounters 20 included in component mounter group 14 is four, the number of slots of pallet 40 is 45, and 12 types of production jobs (jobs J1 to J12) are set in order to produce 12 types of products. In FIG. 5, numeral n in slots n-1 to n-45 represents the position of component mounter 20, and a branch number behind the hyphen represents the position of slot 42 of pallet 40. The number n sets component mounter 20 located on the uppermost stream of the component mounter group 14 as the first (n=1), and counts in ascending order from there toward the downstream.

In FIG. 5, jobs J1 to J3 are assigned to same group G1 because jobs J1 to J3 have a high degree of commonality in type of components. Jobs J4 to J8 are assigned to same group G2 because jobs J4 to J8 have a high degree of commonality in type of components. Jobs J4 to J8 are not assigned to group G1 because the degrees of commonality in type of components with respect to those of jobs J1 to J3 are low. Jobs J9 to J12 are assigned to same group G3 because jobs J9 to J12 have a high degree of commonality in type of components. Jobs J9 to J12 are not assigned to group G1 because the degrees of commonality in type of components with respect to those of jobs J1 to J3 are low, and are not assigned to group G2 because the degrees of commonality in type of components with respect to those of jobs J4 to J9 are low. In a disposition of components among jobs assigned to the same group, components commonly used among multiple jobs are disposed at the same position. Meanwhile, components different from each other are disposed at different positions within a range where there is a space in the slot of each component mounter 20, and components having no space in the slot are disposed at positions overlapping each other. In this case, although the components are different from each other, the components disposed at positions overlapping each other become components to be individually exchanged.

Component mounter group 14 executes processing of jobs J1 to J3 belonging to group G1 in this order, then executes processing of jobs J4 to J8 belonging to group G2 in this order, and then executes processing of jobs J9 to J12 belonging to group G3 in this order. This procedure will be described in detail below.

First, before the processing of job J1 starts, an operator prepares pallet 40 of each component mounter 20. Specifically, the operator sets feeder 30 to be used in job J1 in each pallet 40 in a warehouse located at a different location from component mounter group 14, conveys pallets 40 from the warehouse to component mounter group 14, and attaches pallet 40 to each component mounter 20. After the processing of job J1 is finished and before processing of job J2 starts, feeder 30 of second slot 42 of pallet 40 of second component mounter 20 is automatically exchanged by loader 50. Other slots 42 do not perform a feeder exchange. After the processing of job J2 is finished and before processing of job J3 starts, since it is not necessary to exchange feeder 30, processing of job J3 is directly executed.

Meanwhile, during the processing of group G1 or before the processing of group G1 starts, the operator prepares pallet 40 to be used by each component mounter 20 in group G2. Specifically, the operator sets feeder 30 to be used in job J4 of group G2 in each pallet 40 in the warehouse. After the processing of job J3 of group G1 is finished, the operator conveys pallet 40 of job J4 to component mounter group 14, and attaches pallet 40 to each component mounter 20. After the processing of job J4 is finished and before the processing of job J5 starts, feeder 30 of third slot 42 of pallet 40 of first component mounter 20 and feeder 30 of third slot 42 of pallet 40 of third component mounter 20 are automatically exchanged by loader 50. Other slots 42 do not perform a feeder exchange. After the processing of job J5 is finished and before the processing of job J6 starts, feeder 30 of third slot 42 of pallet 40 of first component mounter 20 and feeder 30 of third slot 42 of pallet 40 of fourth component mounter 20 are automatically exchanged by loader 50. Other slots 42 do not perform a feeder exchange. Thereafter, processing up to job J8 is similarly performed.

During the processing of group G2, before the processing of group G2 starts, or before the processing of group G1 starts, the operator prepares pallet 40 to be used by each component mounter 20 in group G3. Specifically, the operator sets feeder 30 to be used in job J9 in each pallet 40 in the warehouse. After the processing of job J8 of group G2 is finished, the operator conveys pallet 40 of job J9 to component mounter group 14, and attaches pallet 40 to each component mounter 20. After the processing of job J9 is finished and before the processing of job J10 starts, feeder 30 of second slot 42 of pallet 40 of first component mounter 20 and feeder 30 of third slot 42 of pallet 40 of fourth component mounter 20 are automatically exchanged by loader 50. Other slots 42 do not perform a feeder exchange. After the processing of job J10 is finished and before processing of job J11 starts, feeder 30 of second slot 42 of pallet 40 of third component mounter 20 and feeder 30 of third slot 42 of pallet 40 of fourth component mounter 20 are automatically exchanged by loader 50. Other slots 42 do not perform a feeder exchange. Thereafter, processing up to job J12 is similarly performed.

In the example of FIG. 5, a determination criterion in S120 of the grouping routine of the production job may be a condition that the number of individual exchanges of feeder 30 when the production job is switched is three times or less, or may be a condition that the number of individual exchanges of feeder 30 when the production job is switched is 1/15 or less of the total number of feeders 30 (or the total number of slots 42, here, 45).

Here, a correspondence between constituent elements will be clarified. HDD 80d of management computer 80 of the present embodiment corresponds to a storage section in the component mounting system of the present disclosure, and CPU 80a corresponds to a grouping execution section in the component mounting system of the present disclosure. In addition, management computer 80 of the present embodiment corresponds to a data creation device of the present disclosure, HDD 80d corresponds to a storage section in the data creation device of the present disclosure, and CPU 80a corresponds to a grouping execution section in the data creation device of the present disclosure.

In the present embodiment described above, when grouping the multiple production jobs, the production jobs having the degrees of commonality in type of components included in each production job satisfying the predetermined determination criterion are allocated to the same group. Since the production jobs belonging to different groups have a low degree of commonality in type of components, the number of feeders 30 to be exchanged increases, and thus, the collective exchange of pallet 40 can be performed in a shorter time than the individual exchange of feeder 30. Meanwhile, since the production jobs belonging to the same group have a high degree of commonality in type of components, the number of feeders 30 to be individually exchanged can be suppressed, and thus, the individual exchange of feeder 30 can be performed in a shorter time than the collective exchange of pallet 40. Therefore, it is possible to appropriately group the production jobs.

In addition, since the number of feeders 30 to be individually exchanged is suppressed for the production jobs belonging to the same group, a time required for the automatic exchange will not be significantly increased even when there is a limit on the number of feeders 30 that can be automatically exchanged by loader 50 at one time.

Further, the determination criterion in S120 of the grouping routine of the production job has a condition that the number of individual exchanges of feeder 30 when the production job is switched is equal to or less than a predetermined number of times, or a condition that the number of individual exchanges of feeder 30 when the production job is switched is equal to or less than a predetermined ratio with respect to the total number of slots 42. Therefore, it is possible to appropriately group the production jobs in accordance with the number of individual exchanges of feeder 30 when the production jobs are switched.

It is needless to say that the present disclosure is not limited to the above embodiment, and can be implemented in various aspects as long as it belongs to a technical scope of the present disclosure.

For example, in the above embodiment, the individual exchange of feeder 30 is automatically performed by loader 50, but may be performed by an operator instead of loader 50. In particular, in a case where component mounting system 10 does not include loader 50, the operator may individually exchange feeder 30. In this case, a guidance for individual exchange of feeder 30 may be displayed on touch panel display 27 of component mounter 20 or display 82 of management computer 80, and the operator may exchange feeder 30 in accordance with the guidance.

In the above embodiment, for the collective exchange of pallet 40, the operator conveys pallet 40 from the warehouse to component mounter group 14, but an unmanned conveyance vehicle may convey pallet 40 from the warehouse to component mounter group 14. As a result, an operation load on the operator is reduced.

In the above embodiment, a solder printer for printing solder on board S before component mounting may be added to component mounting line 12, or an inspector for inspecting whether a component is correctly mounted on board S after the component mounting may be added thereto. In addition, component mounter group 14 and feeder storage 60 may be adjacent to each other, or a solder printer or the like may be disposed between component mounter group 14 and feeder storage 60.

In the above embodiment, feeder 30 is exemplified as the component supply device, but, the present disclosure is not particularly limited thereto, and, for example, a tray on which multiple components are placed may be adopted as the component supply device.

In the above embodiment, in a case where there is room in slot 42 of pallet 40 of component mounter 20, feeder 30 having components to be used in the next production job or later may be set in empty slot 42 in advance. Since feeder 30 does not have to be exchanged when the production job is switched, an operation time is shortened correspondingly.

In the above embodiment, in the disposition of the components among the jobs assigned to the same group, components that are not common among the multiple jobs are disposed at the positions overlapping each other. However, in a case where the number of components common to multiple jobs exceeds the number of slots of the component mounter, components having a small number of common jobs may be preferentially disposed at positions overlapping other components and individually exchanged.

The component mounting system of the present disclosure may be configured as follows.

The component mounting system of the present disclosure may further a loader configured to move along the conveyance direction and to automatically take out and/or attach the component supply device from and/or to each component mounter included in the component mounter group, in which the loader may perform the individual exchange of the component supply device. As described above, since the production jobs belonging to the same group have a high degree of commonality in type of components, the number of component supply devices to be individually exchanged can be suppressed. Therefore, even when there is a limit on the number of component supply devices that can be automatically exchanged by the loader at one time, the time required for the automatic exchange will not be significantly increased.

The component mounting system of the present disclosure may include an unmanned conveyance vehicle configured to convey the pallet of each component mounter included in the component mounter group, in an unmanned manner, in which the unmanned conveyance vehicle may be used when the collective exchange of the pallet is performed. As a result, an operation load on the collective exchange of the pallet is reduced.

In the component mounting system of the present disclosure, the determination criterion may be a condition that the number of individual exchanges of the component supply device when the production job is switched is equal to or less than a predetermined number of times, or a condition that the number of individual exchanges of the component supply device when the production job is switched is equal to or less than a predetermined ratio with respect to the total number of the component supply devices. According to this configuration, it is possible to appropriately group the production jobs in accordance with the number of individual exchanges of the component supply device when the production jobs are switched.

A data creation device of the present disclosure may be configured as follows.

The data creation device of the present disclosure includes a storage section configured to be provided to each component mounter of a component mounter group in which multiple component mounters in which multiple component supply devices are detachably set in a pallet and configured to mount a component supplied by the component supply device on a mounting target are arranged along a conveyance direction of the mounting target, and to store production jobs including information on what type of component is mounted on a board; and a grouping execution section configured to allocate, when grouping the multiple production jobs, production jobs having a degree of commonality in type of components included in each production job satisfying a predetermined determination criterion to the same group, in which the group is set to perform an individual exchange of the component supply device without performing a collective exchange of the pallet of each component mounter when processing the production job belonging to the same group, and to perform the collective exchange of the pallet of each component mounter and not to perform the individual exchange of the component supply device when processing the production job belonging to different groups.

In this data creation device, when grouping the multiple production jobs, the production job having the degree of commonality in type of components included in each production job satisfying the predetermined determination criterion is allocated to the same group. Therefore, the production job having the degrees of commonality of the types of components included in the production job satisfying the predetermined criterion is not allocated to another group. In addition, in the production job belonging to different groups, the collective exchange of the pallets is performed, and thus, the exchange time is shortened as compared with the individual exchange of the component supply device, and, since the production jobs belonging to the same group have a high degree of commonality in type of components, the number of component supply devices to be individually exchanged can be suppressed. Therefore, it is possible to appropriately group the production jobs.

In the data creation device of the present disclosure, the determination criterion may be the condition that the number of individual exchanges of the component supply device when the production job is switched is equal to or less than a predetermined number of times, or the condition that the number of individual exchanges of the component supply device when the production job is switched is equal to or less than a predetermined ratio with respect to the total number of the component supply devices. According to this configuration, it is possible to appropriately group the production jobs in accordance with the number of individual exchanges of the component supply device when the production jobs are switched.

INDUSTRIAL APPLICABILITY

The present disclosure can be applied to a technical field in which a component is mounted on a mounting target using a component mounter group.

REFERENCE SIGNS LIST

10: component mounting system, 12: component mounting line, 14: component mounter group, 18: X-axis rail, 20: component mounter, 20A: supply area, 20B: stock area, 21: board conveyance device, 22: head, 23: head moving mechanism, 27: touch panel display, 28: mounting control device, 30: feeder, 32: tape reel, 33: tape feeding mechanism, 34: feeder control device, 40: pallet, 42: slot, 45: connector, 50: loader, 50A: upper transfer area, 50B: lower transfer area, 51: loader moving mechanism, 53: feeder transfer mechanism, 55: encoder, 57: loader control device, 60: feeder storage, 80: management computer, 80a: CPU, 80b: ROM, 80c: RAM, 80d: HDD, 82: display, 84: input device

The invention claimed is:

1. A component mounting system comprising:
   a component mounter group in which multiple component mounters in which multiple component supply devices are detachably set in a pallet and configured to mount a component supplied by the component supply device on a mounting target are arranged along a conveyance direction of the mounting target;
   a storage section configured to store multiple production jobs including information on what type of component is mounted on a board; and
   a grouping execution section configured to allocate, when grouping the multiple production jobs, production jobs having a degree of commonality in type of components included in each production job satisfying a predetermined determination criterion to the same group,
   wherein the group is set to perform an individual exchange of the component supply device without performing a collective exchange of the pallet of each component mounter when processing the production job belonging to the same group, and to perform the collective exchange of the pallet of each component mounter and not to perform the individual exchange of the component supply device when processing the production job belonging to different groups.

2. The component mounting system according to claim 1, further comprising:
   a loader configured to move along the conveyance direction and to automatically take out and/or attach the component supply device from and/or to each component mounter included in the component mounter group,
   wherein the loader performs the individual exchange of the component supply device.

3. The component mounting system according to claim 1, further comprising:
   an unmanned conveyance vehicle configured to convey the pallet of each component mounter included in the component mounter group, in an unmanned manner,
   wherein the unmanned conveyance vehicle is used when the collective exchange of the pallet is performed.

4. The component mounting system according to claim 1, wherein the determination criterion is a condition that the number of individual exchanges of the component supply device when the production job is switched is equal to or less than a predetermined number of times, or a condition that the number of individual exchanges of the component supply device when the production job is switched is equal to or less than a predetermined ratio with respect to the total number of the component supply devices.

5. A data creation device comprising:
   a storage section configured to be provided to each component mounter of a component mounter group in which multiple component mounters in which multiple component supply devices are detachably set in a pallet and configured to mount a component supplied by the component supply device on a mounting target are arranged along a conveyance direction of the mounting target, and to store multiple production jobs including information on what type of component is mounted on a board; and
   a grouping execution section configured to allocate, when grouping the multiple production jobs, production jobs having a degree of commonality in type of components included in each production job satisfying a predetermined determination criterion to the same group,
   wherein the group is set to perform an individual exchange of the component supply device without performing a collective exchange of the pallet of each component mounter when processing the production job belonging to the same group, and to perform the collective exchange of the pallet of each component mounter and not to perform the individual exchange of the component supply device when processing the production job belonging to different groups.

6. The data creation device according to claim 5,
wherein the determination criterion is a condition that the number of individual exchanges of the component supply device when the production job is switched is equal to or less than a predetermined number of times, or a condition that the number of individual exchanges of the component supply device when the production job is switched is equal to or less than a predetermined ratio with respect to the total number of the component supply devices.

* * * * *